(12) United States Patent
Marsh et al.

(10) Patent No.: US 9,287,502 B2
(45) Date of Patent: Mar. 15, 2016

(54) RESISTANCE VARIABLE MEMORY CELL STRUCTURES AND METHODS

(71) Applicant: Micron Technology, Inc, Boise, ID (US)

(72) Inventors: Eugene P Marsh, Boise, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 14/035,232

(22) Filed: Sep. 24, 2013

(65) Prior Publication Data

US 2014/0021437 A1 Jan. 23, 2014

Related U.S. Application Data

(63) Continuation of application No. 12/787,018, filed on May 25, 2010, now Pat. No. 8,541,765.

(51) Int. Cl.
*H01L 21/20* (2006.01)
*H01L 45/00* (2006.01)
*H01L 27/10* (2006.01)

(52) U.S. Cl.
CPC .......... *H01L 45/1608* (2013.01); *H01L 27/101* (2013.01); *H01L 45/04* (2013.01); *H01L 45/06* (2013.01); *H01L 45/085* (2013.01); *H01L 45/124* (2013.01); *H01L 45/141* (2013.01); *H01L 45/142* (2013.01); *H01L 45/143* (2013.01); *H01L 45/144* (2013.01); *H01L 45/146* (2013.01); *H01L 45/148* (2013.01);
(Continued)

(58) Field of Classification Search
CPC ... H01L 45/06; H01L 45/124; H01L 45/1608; H01L 45/1691; H01L 27/101

USPC ........................ 257/4, E45.001; 438/382, 622
See application file for complete search history.

(56) References Cited

U.S. PATENT DOCUMENTS 7,292,469 B2   11/2007   Lee et al.
7,335,906 B2   2/2008   Toda
(Continued)

FOREIGN PATENT DOCUMENTS

CN   101523629 A   9/2009
JP   2006229237 A   8/2006
(Continued)

OTHER PUBLICATIONS

First Office Action from related Chinese patent application No. 201180025186.0, dated Nov. 4, 2014, 14 pp.
(Continued)

*Primary Examiner* — Colleen A Matthews
*Assistant Examiner* — Colleen E Snow
(74) *Attorney, Agent, or Firm* — Brooks, Cameron & Huebsch, PLLC

(57) ABSTRACT

Resistance variable memory cell structures and methods are described herein. One or more resistance variable memory cell structures include a first electrode common to a first and a second resistance variable memory cell, a first vertically oriented resistance variable material having an arcuate top surface in contact with a second electrode and a non-arcuate bottom surface in contact with the first electrode; and a second vertically oriented resistance variable material having an arcuate top surface in contact with a third electrode and a non-arcuate bottom surface in contact with the first electrode.

10 Claims, 4 Drawing Sheets

(52) U.S. Cl.
CPC ........ *H01L 45/1616* (2013.01); *H01L 45/1691* (2013.01)

(56) References Cited

U.S. PATENT DOCUMENTS

| | | |
|---|---|---|
| 7,449,711 B2 | 11/2008 | Asano et al. |
| 7,456,460 B2 | 11/2008 | Burr et al. |
| 7,463,512 B2 | 12/2008 | Lung |
| 7,589,344 B2 | 9/2009 | Sato |
| 7,619,915 B2 | 11/2009 | Lee et al. |
| 7,642,539 B2 | 1/2010 | Lung |
| 7,687,881 B2 | 3/2010 | Zahorik |
| 7,872,908 B2 | 1/2011 | Suh et al. |
| 8,030,636 B2 | 10/2011 | Liu |
| 2004/0183107 A1* | 9/2004 | Horii et al. .................. 257/257 |
| 2005/0029503 A1 | 2/2005 | Johnson |
| 2006/0197130 A1 | 9/2006 | Suh et al. |
| 2007/0075304 A1 | 4/2007 | Chang et al. |
| 2007/0238308 A1 | 10/2007 | Niroomand et al. |
| 2008/0035961 A1 | 2/2008 | Chen et al. |
| 2008/0050892 A1 | 2/2008 | Shin et al. |
| 2009/0057643 A1 | 3/2009 | Chen |
| 2009/0184304 A1 | 7/2009 | Chang et al. |
| 2009/0196091 A1 | 8/2009 | Kau et al. |
| 2009/0303781 A1 | 12/2009 | Lowery |
| 2010/0038619 A1 | 2/2010 | Tada et al. |
| 2010/0093130 A1 | 4/2010 | Oh et al. |

FOREIGN PATENT DOCUMENTS

| | | |
|---|---|---|
| JP | 2007035683 A | 2/2007 |
| KR | 10-2006-0002132 A | 1/2006 |
| KR | 102009006436 | 1/2009 |
| WO | 2008117679 A1 | 10/2008 |
| WO | 2009140596 A1 | 11/2009 |

OTHER PUBLICATIONS

Notice of Rejection from Japanese patent application No. 2013-511144, dated Dec. 3, 2013, 11 pp.
Office Action from related Japanese Patent Application No. 2013511144, dated Mar. 25, 2014, 11 pp.
Supplementary Search Report from related European patent application No. 11787006.3, dated Apr. 23, 2015, 5 pp.
International Search Report and Written Opinion for related PCT Application No. PCT/US2011/000811 dated Dec. 20, 2011 (10 pp.).
Office Action from Korean patent application No. 10-2012-0730444, dated Nov. 29, 2013, 9 pp.

* cited by examiner

RESISTANCE VARIABLE MEMORY CELL STRUCTURES AND METHODS

PRIORITY APPLICATION INFORMATION

This application is a Continuation of U.S. application Ser. No. 12/787,018, filed May 25, 2010, the specification of which is incorporated herein by reference.

TECHNICAL FIELD

The present disclosure relates generally to semiconductor memory devices, methods, and systems, and more particularly, to resistance variable memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, such as phase change random access memory (PCRAM), resistive random access memory (RRAM), and conductive bridge random access memory (CBRAM), among others.

The phase change material of a PCRAM device may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state, which may correspond to a data state. PCRAM devices may also be configured to provide multi-level storage. That is, the memory device may have a plurality of discrete and identifiable states which allow for multi-bit storage in a single memory cell.

An RRAM device includes a variable resistive material, such as a transition metal oxide, that has varying resistance depending on voltages applied thereto. When a voltage equal to or greater than a set voltage is applied to the variable resistive material, the resistance of the variable resistive material decreases (e.g., ON state). When a voltage equal to or greater than a reset voltage is applied to the variable resistive material, the resistance of the variable resistive material increases (e.g., OFF state). High volume manufacturability and reliability remain issues for resistance variable memory devices such as PCRAM and RRAM devices.

DETAILED DESCRIPTION

Resistance variable memory cell structures and methods are described herein. A number of methods of forming a resistance variable memory cell structure include forming a memory cell structure having a via formed over a first electrode, forming a resistance variable memory cell material on the first electrode and a wall of the via, forming a first dielectric material on the resistance variable memory cell material, removing a portion of the first dielectric material such that a portion of the resistance variable memory cell material is exposed, and forming a second electrode on a first exposed portion of the resistance variable memory cell material and third electrode on a second exposed portion of the resistance variable memory cell material. One or more methods include forming a spacer material on at least a portion of the second electrode, the third electrode, and the first dielectric material, and forming a first and a second resistance variable memory cell structure by removing at least a portion of the spacer material between the second and third electrodes, at least a portion of the first dielectric material within the via, and at least a portion of the resistance variable memory cell material formed on the first electrode.

Embodiments of the present disclosure provide various benefits such as providing a pitch doubled array having a reduced footprint as compared to previous resistance variable memory cell structures. Embodiments also provide a memory cell structure yielding a low switching current as compared to previous resistance variable memory cell structures, among other benefits. For instance, the pitch doubled vertical orientation of one or more embodiments provide a manufacturable alternative to previous memory cell approaches such as the planar bridge cell structure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

Figure 1A:
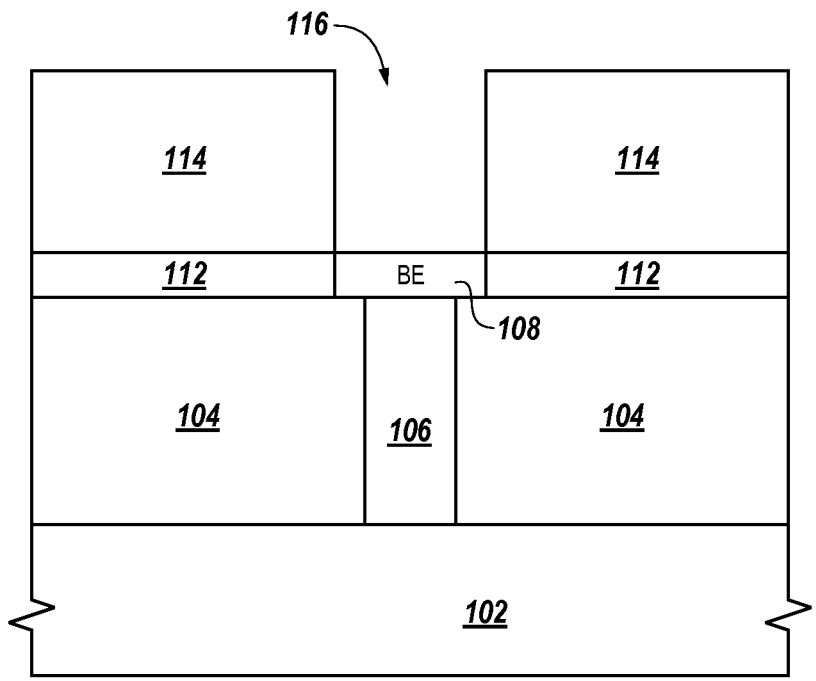
FIGS. 1A-1G illustrate process steps associated with forming a resistance variable memory cell structure in accordance with embodiments of the present disclosure.
Figure 1B:
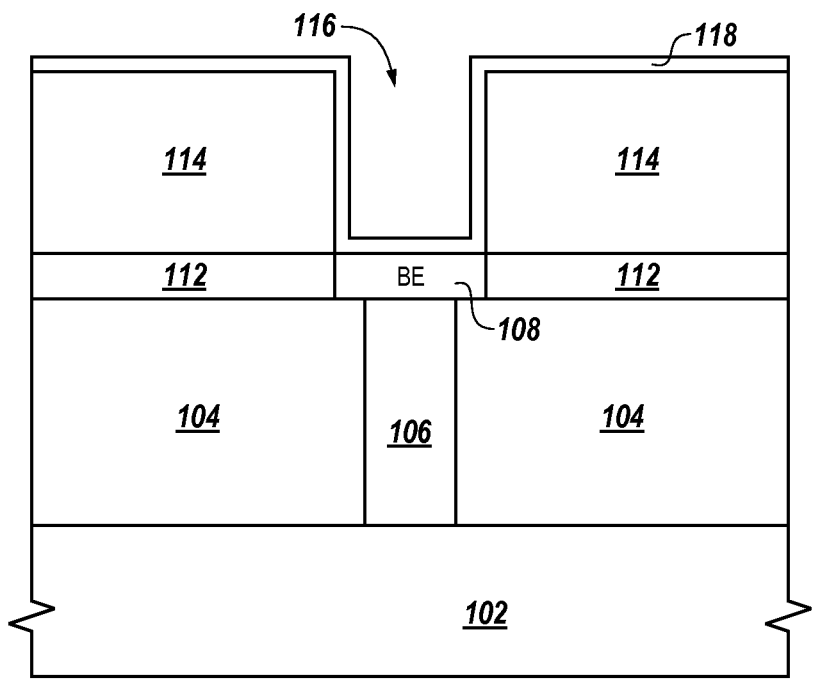
Figure 1C:
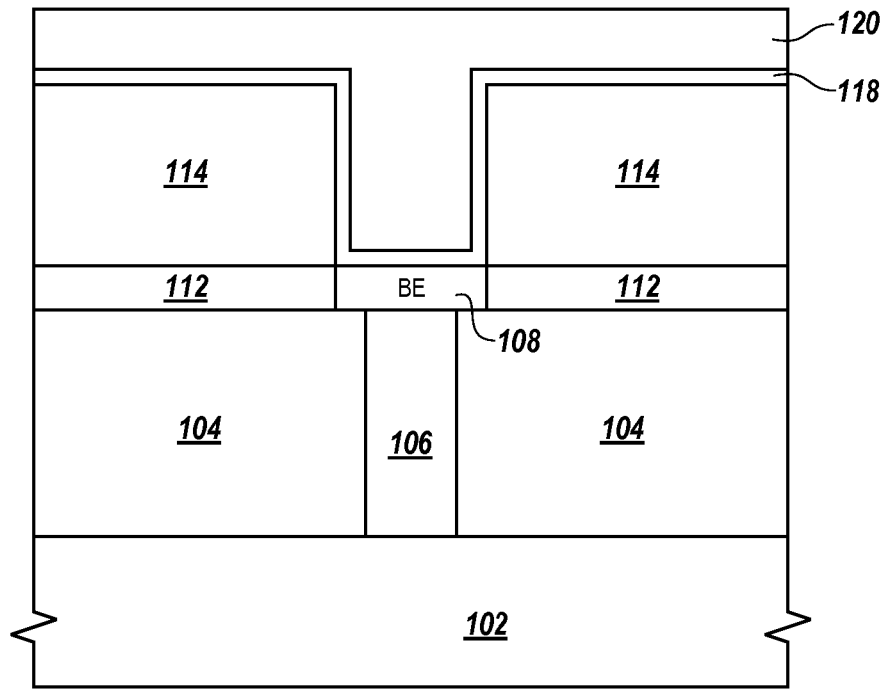
Figure 1D:
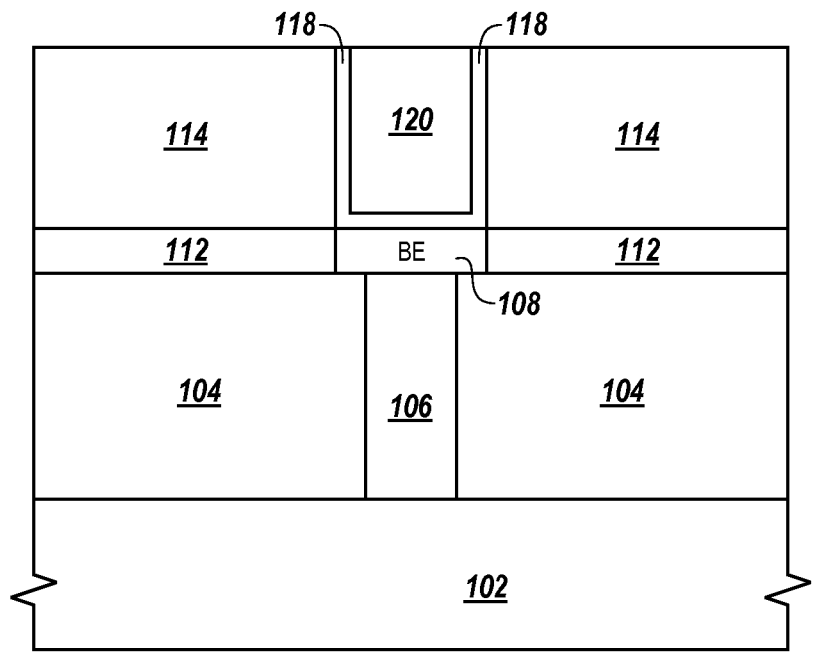
Figure 1E:
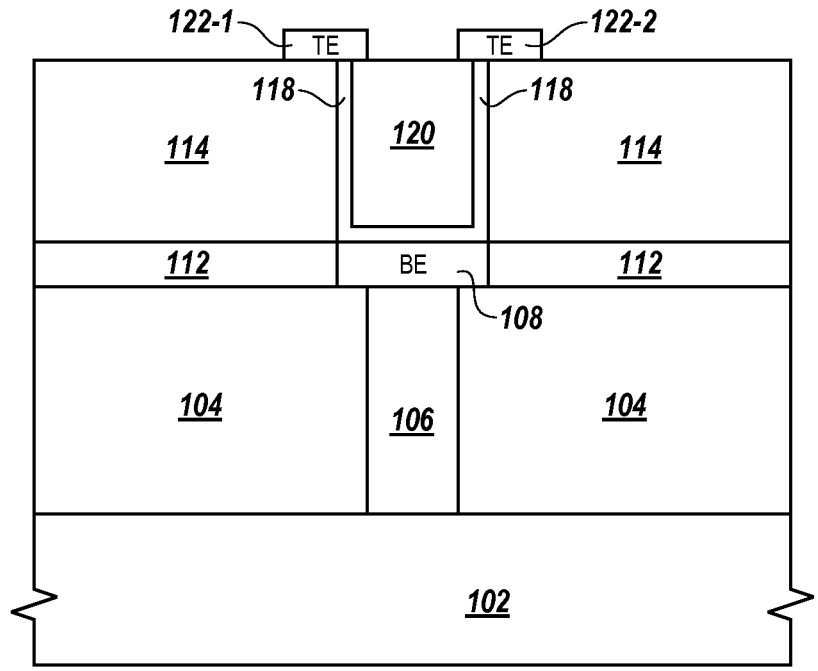
Figure 1F:
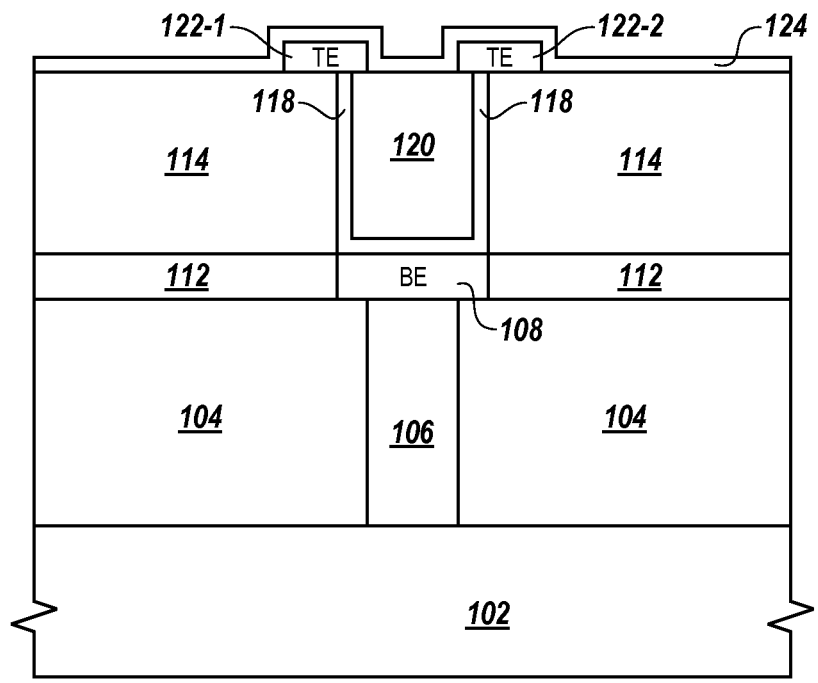
Figure 1G:
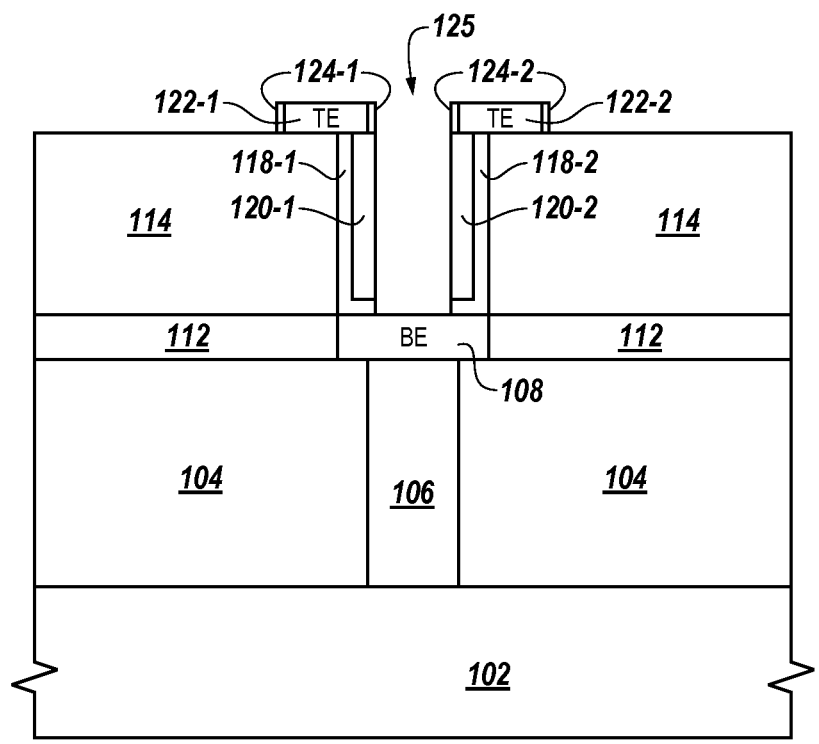

FIGS. 1A-1F illustrate process steps associated with forming the resistance variable memory cell structure shown in FIG. 1G in accordance with embodiments of the present disclosure. The memory cell structure shown in FIGS. 1A-1G includes a base semiconductor structure that includes a substrate 102 including a conductive contact 106 formed in a dielectric material 104. The substrate 102 can be a silicon substrate, silicon on insulator (SOI) substrate, or silicon on sapphire (SOS) substrate, among others. The dielectric material 104 can be a nitride or oxide such as silicon dioxide ($SiO_2$), among other dielectric materials. The conductive contact 106 can be made of tungsten (W) or other suitable conductive material and can be formed in the dielectric layer 104 via a masking and etching process, for instance.

The structure includes a via 116 formed over a bottom electrode (BE) 108. In this example, the via 116 is formed through a dielectric material 114 to expose the top surface of the bottom electrode 108 and can be referred to as a contact hole 116. In one or more embodiments, the via 116 has a diameter of not greater than 20 nanometers (nm). However, embodiments are not limited to a particular diameter of via 116, which can be formed by masking and etching, among other suitable processes. Although the examples described in FIGS. 1A-1F relate to an annular shaped via, embodiments are not so limited. For instance, the via 116 can be various different shapes and can various different aspect ratios associated therewith.

The bottom electrode 108 is formed in a dielectric material 112, such as silicon dioxide, and can be made of various conductive materials or composite structures including tungsten, TiN (titanium nitride), TaN (tantalum nitride), iridium, platinum, ruthenium, and/or copper, for example. As described further herein, the bottom electrode 108 can serve as a common bottom electrode for two distinct resistance variable memory cells (e.g., PCRAM cells, CBRAM cells, or RRAM cells, among others). The bottom electrode 108 is formed on conductive contact 104. Although not shown in FIGS. 1A-1G, the contact 106 can be coupled to an access device (e.g., an access transistor) corresponding to a particular memory cell.

FIG. 1B illustrates a resistance variable material 118 formed on the structure illustrated in FIG. 1A. As such, the material 118 is formed over the bottom electrode 108, the walls of the via 116, and the exposed portions of the dielectric material 114. The material 118 can be formed (e.g., deposited) using techniques such as atomic layer deposition (ALD) or chemical vapor deposition (CVD), among other methods, as will be appreciated by one of ordinary skill in the art. The material 118 is deposited to a thickness of not more than about 5 nm, in some embodiments. In various embodiments, the thickness of material 118 is 1-5 nm.

In embodiments in which the resistance variable memory cell structure is a phase change memory cell structure, the material 118 can be referred to as a phase change material 118. In such embodiments, the phase change material 118 can be a phase change chalcogenide alloy such as a Germanium-Antimony-Tellurium (GST) material (e.g., a Ge—Sb—Te material such as $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other phase change materials can include alloys of: Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In embodiments in which the resistance variable memory cell structure is a resistive random access memory cell structure, the material 118 can be a transition metal oxide ($M_xO_y$) material with the metal (M) being nickel, niobium, titanium, zirconium, hafnium, cobalt, iron, copper, or chrome, for instance. In such embodiments, the material 118 can also be a chalcogenide material or perovskite material, for example.

In embodiments in which the resistance variable memory cell structure is a conductive bridging random access memory cell structure, the material 118 can be an electrolyte material such as a chalcogenide material, for instance. The chalcogenide material can be germanium-sulfide, germanium-selenide, tungsten oxide, or copper sulfide, among other electrolyte materials.

FIG. 1C illustrates a dielectric material 120 formed on the structure shown in FIG. 1B. The dielectric material 120 can be a low temperature oxide or nitride material deposited at a temperature of below about 450° C., for example. The dielectric material 118 is formed on the resistance variable material 118 and fills the via 116.

FIG. 1D illustrates the structure shown in FIG. 1C subsequent to removal of a portion of the dielectric material 120 and a portion of the resistance variable material 118. As an example, the removed portions of materials 118 and 120 can be removed via chemical mechanical planarization (CMP). In the embodiment illustrated in FIG. 1D, the structure is planarized to the surface of the dielectric material 114. As such, an exposed planarized upper surface of the resistance variable material 118 located within the via 116 has an annular shape. That is, the upper surface of the material 118 has an arcuate shape around the planarized upper surface of the dielectric 120 formed in the via 116.

FIG. 1E illustrates the structure shown in FIG. 1D subsequent to formation of a first top electrode (TE) 122-1 and a second top electrode 122-2. The top electrodes 122-1/122-2 are formed on exposed portions of the resistance variable material 118. In this example, the top electrodes 122-1/122-2 are formed such that an edge portion of each of the top electrodes overlaps the planarized surface of the dielectric material 120 within the via 116. The top electrodes 122-1/122-2 are also formed such that they also overlap the dielectric material 114; however, embodiments are not limited to top electrodes that overlap the dielectric material 114. The top electrodes 122-1/122-2 can be made of various conductive materials or composite structures including tungsten, TiN (titanium nitride), TaN (tantalum nitride), iridium, platinum, ruthenium, and/or copper, for example. In one or more embodiments, the bottom electrode 108 and top electrodes 122-1/122-2 can be asymmetric. For instance, the bottom electrode 108 can be made of a different material than one or both of the top electrodes 122-1 and 122-2.

FIG. 1F illustrates the structure shown in FIG. 1E subsequent to a spacer material 124 formed thereon. The spacer material 124 can be an oxide material such as silicon dioxide or other suitable dielectric material.

Figure 1H:
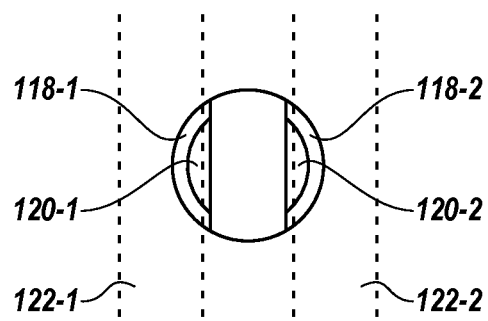
FIG. 1H illustrates a top view of the memory cell structure illustrated in FIG. 1G.

FIG. 1G illustrates the structure shown in FIG. 1F subsequent to removal of at least a portion of the spacer material 124 between the electrodes 122-1 and 122-2, at least a portion of the dielectric material 120 within the via 116, and at least a portion of the resistance variable material 118 formed on the bottom electrode 108. FIG. 1H illustrates a top view of the memory cell structure illustrated in FIG. 1G. In this example, the structure has been patterned and a dry etch process used to form an opening 125 and also create two distinct resistance variable memory cell structures (e.g., PCRAM, CBRAM, or RRAM structures), which share a common bottom electrode 108.

For instance, a first memory cell structure includes the vertically oriented resistance variable material 118-1 located between bottom electrode 108 and top electrode 122-1 and a second memory cell structure includes the vertically oriented resistance variable material 118-2 located between bottom electrode 108 and top electrode 122-2. As illustrated in FIG. 1G, the spacer material 124-1 is formed on the dielectric material 120-1 and on the edges of the top electrode 122-1 and the spacer material 124-2 is formed on the dielectric material 120-2 and on the edges of the top electrode 122-2.

The resistance variable materials 118-1 and 118-2 each have an arcuate top surface in contact with a respective top electrode 1122-1 and 122-2 and a non-arcuate bottom surface in contact with the bottom electrode 108. The non-arcuate portions of the material 118-1 and 118-2 correspond to the portions located beneath the respective dielectric material 120-1 and 120-2 remaining in via 116 subsequent to the etch process. As such, the arcuate portions of the material 118-1 and 118-2 refer to the regions located between the dielectric material 114 and the respective dielectric material 120-1 and 120-2. Accordingly, in various embodiments, the arcuate portions of the first and second vertically oriented resistance variable materials 118-1 and 118-2 are located a distance of not more than 20 nm from each other (e.g., in embodiments in which the diameter of the via 116 is not greater than 20 nm).

Forming memory cell structures according to embodiments described herein can provide two memory cells for a single contact hole (e.g., via 116), which can increase memory density by providing pitch doubling as compared to previous approaches that may provide a single memory cell for a particular contact hole. The vertical orientation of the resistance variable cell material (e.g., 118-1 and 118-2) can also provide increased memory density as compared to previous approaches such as a planar bridge cell approach, for example.

Additionally, embodiments described herein can provide a reduced cross sectional area of the resistance variable material as compared to previous approaches, which can provide a low switching current. Forming resistance variable memory cell structures in accordance with one or more embodiments of the present disclosure can also avoid etch damage of the memory cell structures.

In various embodiments, the processing associated with FIGS. 1F-1H can be optional. For instance, the structure shown in FIG. 1E can represent two resistance variable memory cells that can be operated independently. As such, the spacer material 124 formation and etch to the bottom electrode 108 is optional, in one or more embodiments.

One of ordinary skill in the art will appreciate that an array of resistance variable memory cells including memory cell structures such as those illustrated in FIGS. 1E and 1G would include additional memory components. For instance, a PCRAM and/or RRAM array could include access devices (e.g., access transistors) formed on substrate 102. The bottom electrode 108 can be coupled to an access device (e.g., to a source or drain region via contact plug 106) and the top electrodes 122-1 and 122-2 can be coupled to one or more bit lines (e.g., via contact plugs), for example.

Resistance variable memory cell structures and methods are described herein. A number of methods of forming a resistance variable memory cell structure include forming a memory cell structure having a via formed over a first electrode, forming a resistance variable memory cell material on the first electrode and a wall of the via, forming a first dielectric material on the resistance variable memory cell material, removing a portion of the first dielectric material such that a portion of the resistance variable memory cell material is exposed, forming a second electrode on a first exposed portion of the resistance variable memory cell material and third electrode on a second exposed portion of the resistance variable memory cell material, forming a spacer material on at least a portion of the second electrode, the third electrode, and the first dielectric material, and forming a first and a second resistance variable memory cell structure by removing at least a portion of the spacer material between the second and third electrodes, at least a portion of the first dielectric material within the via, and at least a portion of the resistance variable memory cell material formed on the first electrode.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory cell, comprising:
    forming a memory cell material on a first electrode, wherein the memory cell material is formed on a wall of a via and on the first electrode;
    forming a first dielectric material on the memory cell material;
    removing a portion of the first dielectric material such that a portion of the memory cell material is exposed;
    forming a second electrode on a first exposed portion of the memory cell material and a third electrode on a second exposed portion of the memory cell material; and
    forming a spacer material on at least a portion of the second electrode and on at least a portion of the first dielectric material; and
    forming a first and a second memory cell structure by:
        removing at least a portion of the spacer material between the second and the third electrodes;
        removing at least a portion of the first dielectric material within the via; and
        removing at least a portion of the memory cell material formed on the first electrode.

2. The method of claim 1, wherein forming the first and the second memory cell structures includes:
    forming a first arcuate cell material region corresponding to the first memory cell structure; and
    forming a second arcuate cell material region corresponding to the second memory cell structure.

3. The method of claim 1, including forming the memory cell material such that it has a thickness of no greater than 5 nanometers.

4. The method of claim 1, including forming the spacer material on at least a portion of the third electrode.

5. The method of claim 1, including forming the first electrode of a material that is different than at least one of the second electrode and the third electrode.

6. The method of claim 1, including forming the via through a second dielectric material to the first electrode prior to forming the memory cell material on the first electrode and a wall of the via.

7. The method of claim 1, including forming the second electrode and the third electrode such that a portion of each overlaps the first dielectric material formed in a via.

8. A method of forming a memory cell, comprising:
    forming a memory cell structure having a via formed over a first electrode;
    forming a memory material on the first electrode and on the walls of the via such that a gap remains between the walls of the via;
    forming a first dielectric material on the memory material;
    removing a portion of the first dielectric material such that a portion of the memory material is exposed;
    forming a second electrode on a first exposed portion of the memory material and forming a third electrode on a second exposed portion of the memory material;

forming a spacer material on at least a portion of the second electrode and on at least a portion of the first dielectric material; and removing at least a portion of the spacer material between the second and third electrodes, at least a portion of the first dielectric material within the via, and at least a portion of the memory material formed on the first electrode such that a first and a second phase change memory cell structure is formed.

9. The method of claim 8, including forming the second and third electrodes such that they overlap the first dielectric material located in a gap between the walls of the via.

10. A method of forming a memory cell, comprising:

forming a memory cell material on a first electrode;

forming a first dielectric material on the memory cell electrode;

removing a portion of the first dielectric material such that a portion of the memory cell material is exposed;

forming a second electrode on a first exposed portion of the memory cell material and a third electrode on a second exposed portion of the memory cell material; and forming a spacer material on at least a portion of the second electrode and on at least a portion of the first dielectric material; and forming the first electrode of a material that is different than at least one of the second electrode and the third electrode.

* * * * *